United States Patent [19]
Itoh

[11] 4,085,457
[45] Apr. 18, 1978

[54] MEMORY SYSTEM WITH A SENSE CIRCUIT

[75] Inventor: Kiyoo Itoh, Higashi-kurume, Japan

[73] Assignee: Hitachi, Ltd., Japan

[21] Appl. No.: 672,154

[22] Filed: Mar. 31, 1976

[30] Foreign Application Priority Data

Mar. 31, 1975 Japan .................................. 50-37985

[51] Int. Cl.² ............................................... G11C 7/06
[52] U.S. Cl. ...................................... 365/205; 307/238
[58] Field of Search ................. 307/238; 340/173 FF, 340/173 CA, 173 R

[56] References Cited

U.S. PATENT DOCUMENTS 3,678,473  7/1972  Wahlstrom .................... 340/173 CA
3,714,638  1/1973  Dingwall et al. ............. 340/173 FF
4,003,035  1/1977  Hoffman et al. .............. 340/173 CA Primary Examiner—Stuart N. Hecker

[57] ABSTRACT

In a memory system comprised of a memory array having a plurality of first data lines each of which has a plurality of memory cells connected thereto and a sense circuit for discriminating the information in the memory cells, the sense circuit includes a pair of second data lines, a pair of switching elements for selectively connecting two first data lines on the memory array with the pair of second data lines in response to applied address signals, and a sense amplifier comprising a flip-flop circuit having two input nodes connected to said pair of second data lines.

13 Claims, 8 Drawing Figures

MEMORY SYSTEM WITH A SENSE CIRCUIT

BACKGROUND OF THE INVENTION

This invention relates to a memory system with a sense circuit.

In a semiconductor memory using a one transistor-cell, a signal read out from the cell is of low level. Therefore, in the prior art memory system, a signal on a data line connected with a desired cell is applied to a preamplifier together with a reference signal on a data line connected with a dummy cell when word signals are applied to these cells. Then, the signal on a selected one of two data lines, which is amplified by the preamplifier is applied to a main amplifier connected with a common data line.

In such a memory system, the common data line having a large stray capacitance is driven by the preamplifier having a plurality of MOS (metal-oxide-semiconductor) transistors. Therefore, in order to achieve high speed reading, it is necessary to increase the conductance of these MOS transistors. However, since the increase of the conductance brings about an increase of the consumed power and the size of the system, the increase in conductance which is practically attainable has been limited.

SUMMARY OF THE INVENTION

An object of this invention is to provide a memory system which can read out the information at high speed.

Another object of this invention is to provide a memory system which can be operated with low power consumption.

In order to achieve such objects, this invention is characterized by providing a sense amplifier which is connected through switching elements to two data lines to which respective memory cells are connected, and which amplifies differentially signals on these data lines. When a signal on one of the data lines is applied to the sense amplifier by the turn-ON of the corresponding switching element, this signal is discriminated very fast by the combined effect of the capacitive unbalance and the voltage unbalance at the two input nodes of the sense amplifier.

DETAILED DESCRIPTION OF THE PRIOR ART

Figure 1:
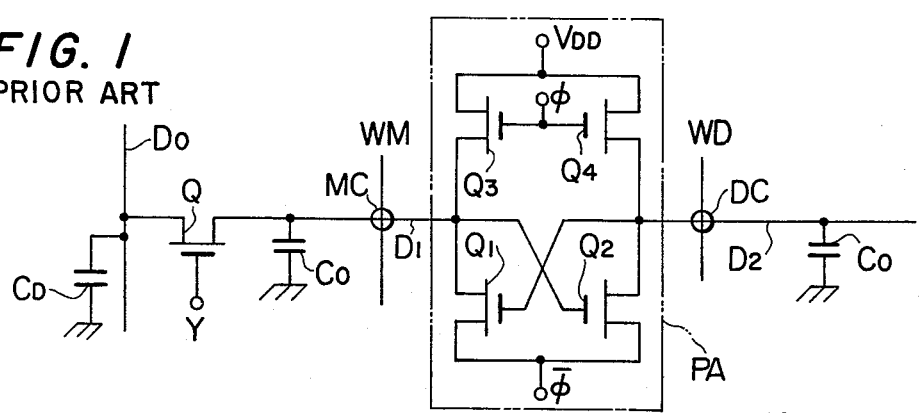
FIG. 1 is a schematic circuit diagram showing a prior art memory system.

FIG. 1 shows a prior art memory system using a single transistor-cell memory. In FIG. 1, a pair of data lines D1 and D2 are connected to two input nodes of a preamplifier PA. A plurality of memory cells and a dummy cell are connected to each of the data lines D1 and D2; however, for simplicity of description, only the memory cell MC and dummy cell DC are shown.

The preamplifier PA has a first series circuit of MOS transistors Q1 and Q3 and a second series circuit of MOS transistors Q2 and Q4. The connection point between transistors Q1 and Q3 of the first series circuit, forms one input node of the preamplifier and is connected to the gate of MOS transistor Q2, and the connection point between transistors Q2 and Q4 of the second series circuit forms the other input node of the preamplifier and is connected to the gate of MOS transistor Q1. A control signal $\phi$ is applied in common to the gates of MOS transistors Q3 and Q4. Furthermore, supply voltage VDD and a control signal $\bar{\phi}$ are applied to respective ends of the first and second series circuits.

Data line D1 is connected to a common data line D0 through a MOS transistor Q which is turned ON by an address signal Y selectively applied to the gate thereof. The common data line D0 is connected to a main amplifier (not shown in the drawing). C0 represents the stray capacitance of data lines D1 and D2, and CD represents a sizeable stray capacitance of the common data line D0. With such a construction, when the information in a desired memory cell MC is to be read out, word signals WM and WD are applied to memory cell MC and dummy cell DC, respectively. When control signals $\phi$ and $\bar{\phi}$ are applied to the preamplifier PA, a small read signal on data line D1, generated from memory cell MC, is amplified by preamplifier PA, using the read signal on data line D2, generated from dummy cell DC as a reference level. When address signal Y is applied to the gate of MOS transistor Q, a signal on data line D1, amplified by the preamplifier PA is applied through MOS transistor Q to the common data line D0 and is then amplified by the main amplifier.

In such a memory system, the common data line D0, which has a large stray capacitance CD, is driven by the preamplifier PA having MOS transistors Q1 to Q4. Therefore, in order to achieve a high reading speed, it is required to increase the conductance of these MOS transistors Q1 to Q4. However, since an increase in the conductance of these transistors brings about an increase of the consumed power of the system, the possible increase in conductance is limited. Therefore, it has been impossible to read out information from such a memory system at high speed.

DETAILED DESCRIPTION OF THE PREFERRED EMBODIMENTS

Figure 2:
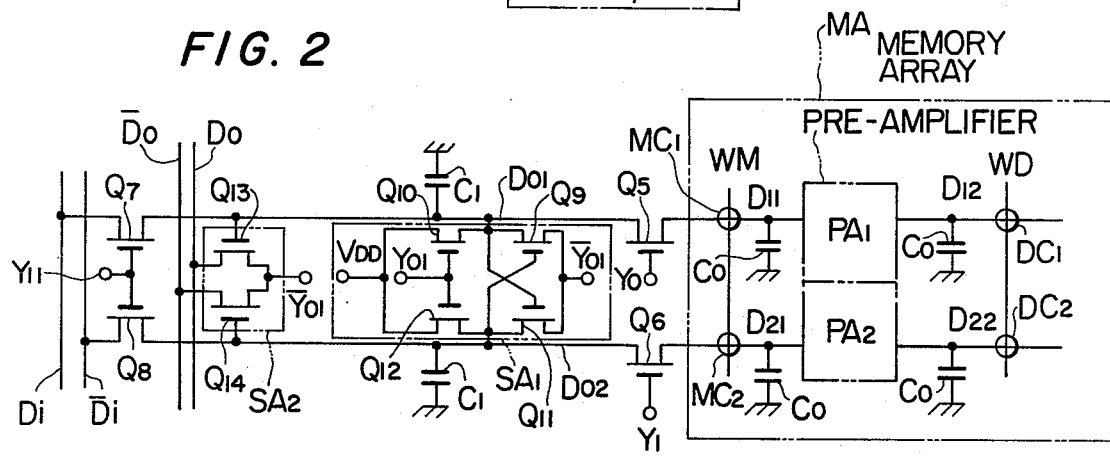
FIG. 2 is a schematic circuit diagram showing an embodiment of a memory system according to this invention.
Figure 3A:
FIG. 3, consisting of 3a through 3e, is a timing chart illustrating various signals appearing at points of the system shown in FIG. 2.
Figure 3B:
Figure 3C:
Figure 3D:
Figure 3E:

FIG. 2 shows an embodiment of a memory system according to this invention. In FIG. 2, a memory array MA includes a plurality of memory circuits each having a pair of data lines associated therewith and a preamplifier, such as shown in FIG. 1. For example, the memory array MA includes a first memory circuit having a pair of data lines D11 and D12 and preamplifier PA1, as well as a second memory circuit adjacent to the first memory circuit and having a pair of data lines D21 and D22 and a preamplifier PA2. Word signal WM is applied in common to memory cells MC1 and MC2 connected to the data lines D11 and D21, respectively, and word signal WD is applied in common to dummy cells DC1 and DC2 connected to data lines D12 and D22, respectively.

A pair of data lines D01 and D02 are connected to data lines D11 and D21 through MOS transistors Q5 and Q6, respectively. The data lines D01 and D02, further, are connected to a pair of common writing data lines Di and $\overline{\text{Di}}$ through MOS transistors Q7 and Q8, respectively.

Two input nodes N1 and N2 of a flip-flop type sense amplifier SA1 are connected to the data lines D01 and D02. Furthermore, the lines D01 and D02 are connected also to a sense amplifier SA2.

Sense amplifier SA1 includes a first series circuit of MOS transistors Q9 and Q10 and a second series circuit of MOS transistors Q11 and Q12. The connection point between MOS transistors Q9 and Q10 forming one input node N1 to the amplifier is connected to the gate of MOS transistor Q11, and the connection point of MOS transistors Q11 and Q12 forming the other input node N2 to the amplifier is connected to the gate of MOS transistor Q9. A control signal Y01 is applied in common to the gates of MOS transistors Q10 and Q12. Supply voltage VDD and a control signal $\overline{Y01}$ are applied to the respective ends of the first and second series circuits, respectively.

Sense amplifier SA2 is made up of MOS transistors Q13 and Q14, the gates of which are connected to data lines D01 and D02, respectively, and the drains (sources) of which are connected to common sensing data lines D0 and $\overline{D0}$, respectively. Control signal $\overline{Y01}$ is applied in common to the sources (drains) of MOS transistors Q13 and Q14. The common sensing data lines D0 and $\overline{D0}$ are connected to two input terminals of a main amplifier (not shown in the drawing).

Address signals Y0 and Y1 are applied to the gates of MOS transistors Q5 and Q6, respectively, and a writing control signal Y11 is applied in common to the gates of MOS transistors Q7 and Q8. A pair of capacitors $C_1$ are connected between the respective data lines D01 and D02 and ground.

FIG. 3 shows the waveform of selected signals at various points in FIG. 2. In FIG. 3, line (a) represents the word signal WM or WD; line (b) represents the address signal Y0 applied to MOS transistor Q5; line (c) represents the control signal Y01; line (d) represents a signal on data line D01; and line (e) represents a signal on common data line D0.

The operation of a memory system shown in FIG. 2 is explained in detail hereinafter referring to FIG. 3. Data lines D11, D12, D21, D22, D01 and D02 are precharged by conventional precharge circuits (not shown in the drawing). When the information in memory cell MC1, for example, is read out, word signals WM and WD shown in line (a) of FIG. 3 are applied to memory cells MC1 and MC2 and to dummy cells DC1 and DC2. A signal on data line D11, read out from memory cell MC1 is amplified by preamplifier PA1, using a signal on data line D12 as a reference level. Then, address signal Y0 shown in line (b) of FIG. 3 is applied to the gate of MOS transistor Q5 and this transistor Q5 is made conductive thereby. Therefore, the signal on data line D11 is transferred to data line D01 through MOS transistor Q5.

On the other hand, the information in memory cell MC2 is also read out on data line D21. However, the signal on data line D21 is not transferred to data line D02, because no address signal Y1 is applied to the gate of MOS transistor Q6.

If a signal on data lines D01 and D11 is at a high level, a capacitive unbalance is established at nodes N1 and N2, that is, C0 + C1 at node N1 and C1 at node N2. Therefore, node N1 and data line D01 are readily charged up with the aid of the capacitive unbalance when control signal Y01, such as shown in line (c) of FIG. 3, and control signal $\overline{Y01}$ are applied to sense amplifier SA1. If control signals Y01 and $\overline{Y01}$ are at a supply voltage level VDD and ground level, respectively, the signal on data line D01 rapidly changes from a precharge level VP to a high level VDD, as shown by the solid line in line (d) of FIG. 3. On the other hand, the signal on data line D02 changes from the precharge level VP to a low level (ground level).

However, if the signal on data lines D01 and D11 is at a low enough level to cancel this capacitive unbalance, node N1 and data line D01 are discharged and node N2 is charged up. Therefore, the signal on data line D01 rapidly changes from the precharge level VP to ground level (zero level), as shown by the dotted line in line (d) of FIG. 3, and the signal on data line D02 changes from the precharge level VP to a high level. Thus, successful discrimination of the information ("1" and "0") stored in the memory cells is performed.

The thus-obtained signal on data line D01 is amplified by MOS transistor Q13 of sense amplifier SA2 and is applied to common data line D0 as an output signal, such as shown in line (e) of FIG. 3. Differential output signals on common data lines D0 and $\overline{D0}$ are applied to two input terminals of the main amplifier.

When the information is to be written in a desired memory cell, for example, MC1, control signal Y11 is applied to the gates of MOS transistors Q7 and Q8. Differential data signals on common data lines Di and $\overline{Di}$ are applied through MOS transistors Q7 and Q8 to data lines D01 and D02. When address signal Y0 is applied to the gate of MOS transistor Q5 and word signal WM is applied to memory cell MC1, the data signal on data line D01 is applied through data line D11 to memory cell MC1. On that occasion, sense amplifiers SA1 and SA2 are not operated.

Reading from and writing into a memory cell, for example, cell MC2 connected to data line D21, is executed in a similar manner to that described above by means of the application of address signal Y1 to transistor Q6.

In the above-described system, since sense amplifier SA1 comprises a flip-flop of the positive feedback type, discrimination of the read information is performed at high speed. Thereupon, even if the conductance of the MOS transistors in the sense amplifier SA1 is increased in order to perform the reading operation at an increased high speed, the power consumed by the sense amplifier SA1 is comparatively small since this sense amplifier is selectively operated. Since the conductance of the MOS transistors in the preamplifiers PA1, PA2, etc. may be a small value, the power consumed by the preamplifiers is also a small quantity. Thus, the increase in conductance is not limited. Therefore, it is possible to design a system which reads out the information at high speed without increasing the power consumption.

The sense amplifier SA2 is provided in the above-described system in which the reading operation may be performed at higher speed; however, it is possible to eliminate the sense amplifier SA2 and to directly connect data lines D01 and D02 to the common data lines D0 and $\overline{D0}$, respectively. Since it is required to provide complicated peripheral circuits in the memory system shown in FIG. 2, the circuit arrangement of FIG. 2 is expanded in a vertical direction. In order to arrange the memory circuit so that the pitch between the data lines D01 and D02 connected to the peripheral circuits coincides with the pitch between data lines D11 and D21 connected to the memory cells, it is desirable to use memory cells which are arranged in zigzag fashion on both sides of the data line or which are of a slender form in the vertical direction.

Figure 4:
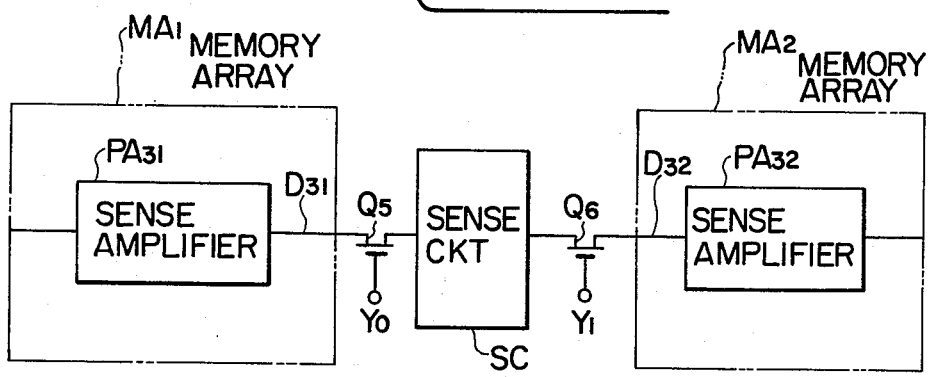
FIG. 4 is a schematic block diagram showing an outline of another embodiment of a memory system according to this invention.

FIG. 4 shows the basic construction of another embodiment of a memory system according to this invention. Although two data lines adjacent to each other on one memory array are connected to respective input nodes of the sense amplifier in the embodiment of FIG. 2, two data lines D31 and D32 connected to the memory arrays MA1 and MA2 are connected to respective input nodes of a sense amplifier in a sense circuit SC through MOS transistors Q5 and Q6 in the embodiment of FIG. 4. That is, one data line D31 connected to a preamplifier PA31 on one memory array MA1 is connected to the sense circuit SC through MOS transistor Q5, and one data line D32 connected to a preamplifier PA32 on the other memory array MA2 is connected to the sense circuit SC through MOS transistor Q6.

The sense circuit SC includes a pair of data lines D01 and D02, sense amplifiers SA1 and SA2, common sensing data lines D0 and $\overline{D0}$, common writing data lines Di and $\overline{Di}$, MOS transistors Q7 and Q8, etc., for example as shown in FIG. 2. Therefore, data lines D31 and D32 on memory arrays MA1 and MA2 are connected to data lines D01 and D02, that is, to the two input nodes N1 and N2 of sense amplifier SA1, respectively. Address signals Y0 and Y1 are applied to the gates of MOS transistors Q5 and Q6.

Although only one data line is shown in each of the memory arrays MA1 and MA2, there are in practice a plurality of data lines and word lines therein. Furthermore, the sense circuit SC can be connected in common to plural pairs of data lines on a plurality of memory arrays by selectively connecting each of the pairs to the sense circuit. In FIGS. 2 and 4, each data line on each memory array is connected with a preamplifier to amplify a signal on data line. However, if necessary, it is possible to eliminate the preamplifier.

What is claimed is:

1. A memory system comprising:
   first and second data lines, to each of which a plurality of memory cells for storing information are connected;
   third and fourth data lines;
   first and second switching means for individually connecting said first and second data lines on a selective basis to said third and fourth data lines, respectively, in response to respective first and second address signals respectively applied to said first and second switching means; and
   a sense amplifier comprised of a flip-flop circuit having first and second input nodes connected to said third and fourth data lines, respectively.

2. A memory system according to claim 1, which further comprises first and second common writing data lines, and third and fourth switching means for selectively connecting said first and second common writing data lines to said third and fourth data lines, respectively, in response to a writing control signal.

3. A memory system according to claim 1, in which said first switching means includes a first MOS transistor having an input terminal to which said first address signal is applied, and first and second output terminals which are connected to said first and third data lines, respectively; and wherein said second switching means includes a second MOS transistor having an input terminal to which said second address signal is applied, and first and second output terminals which are connected to said second and fourth data lines, respectively.

4. A memory system according to claim 1, wherein said first and second data lines are arranged on the respective memory arrays.

5. A memory system according to claim 1, in which said flip-flop circuit comprises first, second, third and fourth MOS transistors, each having an input terminal and first and second output terminals, said first output terminals of said first and second MOS transistors being connected in common to said first input node and said input terminal of said third MOS transistor, and said first output terminals of said third and fourth MOS transistors being connected in common to said second input node and said input terminal of said first MOS transistor, means for applying a source voltage to said second output terminals of said second and fourth MOS transistors, means for applying a first control voltage to said input terminals of said second and fourth MOS transistors, and means for applying a second control voltage to said second output terminals of said first and third MOS transistors.

6. A memory system according to claim 5, in which each of said first and second data lines includes a pair of data line portions, and which further comprises a preamplifier having respective first and second input nodes connected to said data line portions.

7. A memory system according to claim 6, which further comprises first and second common sensing data lines and a second sense amplifier connected between said third and fourth data lines and said first and second common sensing data lines for applying amplified signals to said first and second common sensing data lines.

8. A memory system according to claim 6, which further comprises first and second common writing data lines, and third and fourth switching means for selectively connecting said first and second common writing data lines to said third and fourth data lines, respectively, in response to a writing control signal.

9. A memory system according to claim 8, wherein said first switching means includes a fifth MOS transistor having an input terminal to which said first address signal is applied, and first and second output terminals which are connected to said first and third data lines, respectively; and wherein said second switching means includes a sixth MOS transistor having an input terminal to which said second address signal is applied, and first and second output terminals which are connected to said second and fourth data lines, respectively.

10. A memory system according to claim 1, in which each of said first and second data lines includes a pair of data line portions, and which further comprises a preamplifier having respective first and second input nodes connected to said data line portions.

11. A memory system according to claim 10, wherein a plurality of memory cells and a dummy cell are connected to each of said data line portions so that, when information in one memory cell connected to one of said data line portions is read out, information in the dummy cell connected to the other data line portion is read out as a reference signal.

12. A memory system according to claim 1, which further comprises first and second common sensing data lines and a second sense amplifier connected between said third and fourth data lines and said first and second common sensing data lines for applying amplified signals to said first and second common sensing data lines.

13. A memory system according to claim 12, wherein each of said first and second data lines includes a pair of data line portions, to each of which a plurality of memory cells and a dummy cell are connected so that, when information in one memory cell connected to one of said data line portions is read out, information in the dummy cell connected to the other data line portion is read out as a reference signal, and a preamplifier having respective first and second input nodes connected to said data line portions.

* * * * *